Oct. 22, 1968

H. E. AMRINE ETAL 3,407,359

DUAL GAIN TRANSISTOR CIRCUIT

Filed Dec. 21, 1964

INVENTORS
HERMAN EUGENE AMRINE
JAMES P. MARTIN

BY W. G. Robertson

ATTORNEY

United States Patent Office 3,407,359

Patented Oct. 22, 1968

3,407,359

DUAL GAIN TRANSISTOR CIRCUIT

Herman Eugene Amrine, San Jose, Calif., and James P. Martin, Poughkeepsie, N.Y., assignors to International Business Machines Corporation, New York, N.Y., a corporation of New York Filed Dec. 21, 1964, Ser. No. 419,651
7 Claims. (Cl. 330—29)

ABSTRACT OF THE DISCLOSURE

This disclosure teaches a connection of two transistors in a circuit configuration in which the emitter current of the first transistor is the base current of the second transistor in which a nonlinear element is connected in the collector circuit of the first (or the second) transistor. When the nonlinear element is in its low conduction state, the input transistor does not amplify. However, it conducts in its base-emitter circuit to supply base current to the second transistor. Thus, in this state the circuit has the amplification of only the second transistor.

When the nonlinear device is in its conduction state, both transistors amplify and the circuit has a higher amplification.

In one embodiment the nonlinear device is a silicon diode, and in another embodiment it is a transistor connected to operate as a switch.

In the familiar situation, a semiconductor amplifying circuit is intended to amplify all components of an input signal equally and the amplifier is usually said to distort the signal when it is operated outside its linear region. In such a circuit the gain of several stages is the product of the gains at each stage of the circuit. There are also applications for circuits in which the gain should be variable, either in response to a selected characteristic of the input signal or in response to a separate controlling signal. An important example of such an application is a circuit to operate a direct current motor in different speed or torque ranges. A general object of this invention is to provide a new and improved semiconductor circuit in which the gain can be controlled, either as a function of the amplitude of the input signal or as a function of a separate controlling signal.

A more specific object is to provide a new and improved semiconductor circuit that can be operated to have a selected one of two gains. Another more specific object of this invention is to provide a new and improved semiconductor circuit having its gain adjustable at either of two levels and in which the gain is kept substantially invariant while the circuit is operating at the selected level.

The circuit of this invention uses the characteristic of a transistor that it can function as a simple diode between its base and emitter terminals in addition to its usual transistor function as a three terminal amplifying device. In the current of this invention a first transistor is connected to establish in its emitter circuit a signal that can be applied to a load device or, preferably, to a second transistor amplifying stage. The collector current of the transistor is controlled to be approximately either on or off, so that in one state the transistor functions in the circuit of its base and emitter terminals as a simple diode without amplification and in the other state it functions as an amplifying transistor having a load conventionally connect in its emitter circuit. Preferably, a second transistor is connected to amplify the output of the first transistor to provide two gains, each of which is greater than unity.

In one embodiment of the invention, the operation of the first transistor is controlled by a diode connected in the transistor collector circuit; the diode has a significantly nonlinear forward volt-ampere characteristic so that in its low current state it functions to isolate the collector terminal from a biasing source and in the other state it functions to connect the collector terminal to its biasing source to function as a normal transistor. The diode is controlled to switch between these two states. In a second embodiment of the invention, a controllable conduction device such as a transistor is connected to perform the same function as the diode in response to a controlling signal.

The detailed description of the invention will suggest other goals of variable gain circuits and corresponding further objects and features of the circuits of this invention.

*The drawing*

Figure 1:
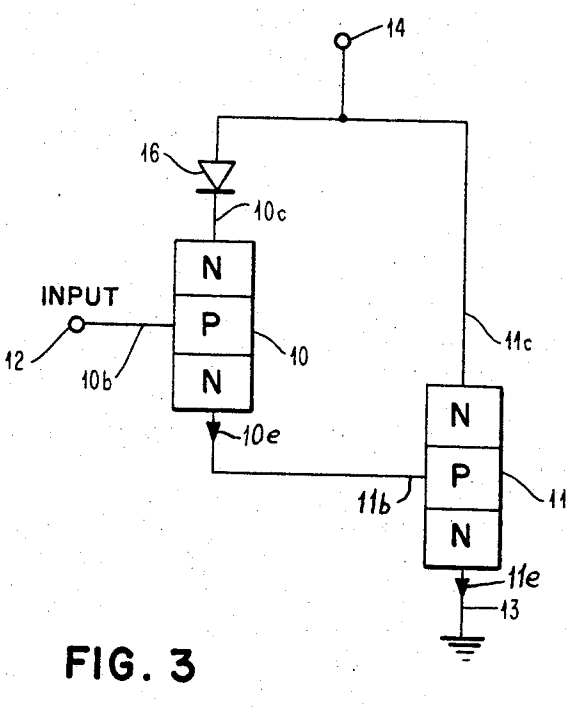
FIG. 1 is a schematic of one embodiment of the circuit of this invention.

The circuit of FIG. 1 comprises two transistors 10 and 11 connected to form a three terminal device in which the base terminal **10*b* of transistor 10 is connectable to an input terminal 12, the emitter terminal 11*e* of transistor 11 is connectable to terminal 13 which is common to the input and output circuits, and the collector terminal 11*c* of transistor 11 is connected to an output terminal 14. Transistor 10 has its emitter terminal 10*e* connected to the base terminal 11*b* of transistor 11 to establish a base current in transistor 11 that equals the sum of the collector current and the base current for transistor 10. A diode 16 connects the collector terminal 10*c* of transistor 10 to output terminal 14. Diode 16 is preferably a silicon diode, more generally a nonlinear device having a volt-ampere characteristic with an appreciable offset or threshold voltage required for conduction and a region of rather low dynamic resistance above the threshold voltage. Diode 16 is connected to conduct in a forward direction in series with the emitter-collector circuit of transistor 10 so that in one operating state diode 16 functions substantially as a closed circuit and the two transistors both amplify. Thus, the combination of transistor 10 and diode 16 establishes a volt-ampere characteristic having two separate regions of differing gain. When the voltage across the terminals 11*c*, 11*e* is below the threshold voltage of diode 12, transistor 10 conducts in its base emitter circuit without amplification; that is, transistor 10 has substantially a gain of unity. When the voltage across terminals 11*c*, 11*e* is above the diode threshold voltage, transistor 10 amplifies substantially conventionally and cooperate with transistor 11** to form a two-stage amplifying circuit. Means to control the voltage across the diode and useful applications of the circuit will be explained in connection with FIG. 2.

Figure 2:
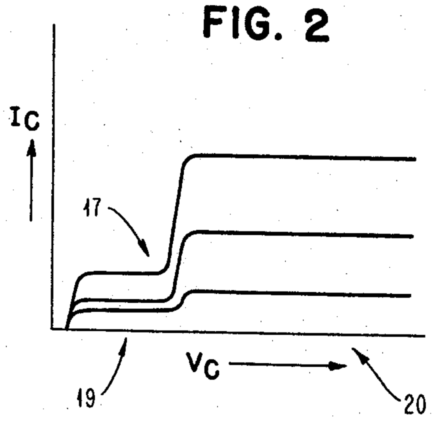
FIG. 2 is a family of volt-ampere curves for the circuit of FIG. 1.

In FIG. 2 the horizontal axis represents qualitatively the voltage across terminals 13, 14 and the vertical axis represents the current at the terminal 13 or 14 to which a load is connected. The family of lines within the coordinates indicates the relation between voltage and current for particular values of current at input terminal 12. Except for the bend in the curves at about point 17, FIG. 2 is identical to well-known transistor amplifier characteristic curves. As the vertical spacing between the input current lines indicates, the circuit has a region 19 of low gain and a region 20 of high gain.

One way to use the characteristic of the circuit is to connect the circuit to energize a load (at either or both output terminals 13, 14) that establishes a load line running through both regions 19, 20 of FIG. 2. In this circuit the gain of the circuit varies with the operating point on the load line which in turn is controlled by the input signal. A significant example of this application of the circuit is a squelch circuit in which the transistors are connected to conduct with low amplification when the voltage across terminals 13, 14 is below point 17 and to conduct with higher amplification when the voltage is above point 17.

Another way to use the two gain regions of the circuit of FIG. 1 is to connect the circuit to energize a load that establishes a load line running through only one of the regions of the volt-ampere characteristic of FIG. 2 and to switch the voltage applied to the circuit of FIG. 1 and its load to position the load line in one or the other of the two regions. An important example of this application is when the circuit is used as a current source for driving magnetic cores; such a load has only negligible resistance and establishes a substantially vertical load line.

Another means to use either region 19, 20 selectively is to connect the circuit to energize a reactive load or to connect reactances in the circuit of FIG. 1 to provide a D.C. load line in one region and an A.C. load line extending into both regions. For example, connecting an inductor in series with diode 16 would provide a time delay in reaching the voltage to turn on the diode.

Figure 3:
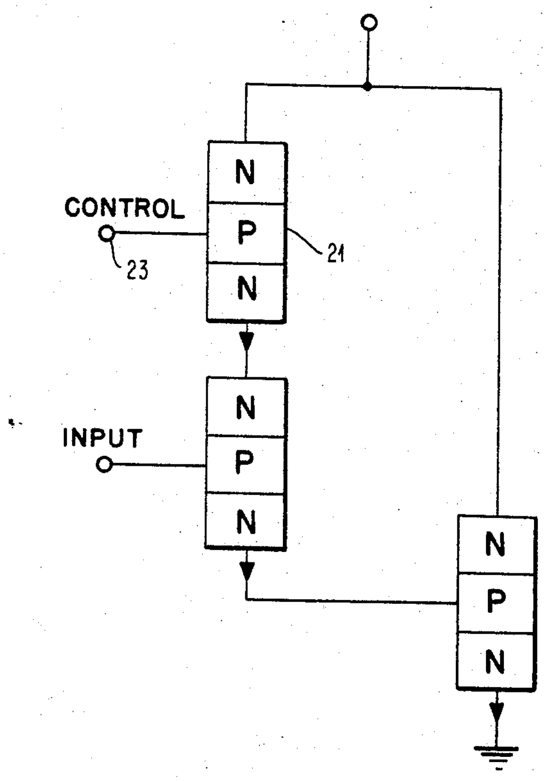
FIG. 3 is a schematic of a second embodiment of the invention.

The circuit of FIG. 3 is similar to the circuit of FIG. 1 except that the conduction in the collector circuit of the transistor 10 is controlled by a controlled conduction device illustrated as a transistor 21. Transistor 21 has its emitter terminal **21*e* connected to the collector terminal of transistor 10 (because transistors 10 and 21 are illustrated as like conductivity types) and has its collector terminal connected to the collector terminal 11*c* of transistor 11. The base terminal 21*b* of transistor 21 is connectable to a terminal 23 to receive a suitable signal to turn on or off transistor 21**.

The circuit of FIG. 3 can be described by two conventional volt-ampere characteristics, one having a low gain like the region 19 of FIG. 2 and one having a high gain like the region 20 of FIG. 2. Operating transistor 21 switches the circuit from one condition to the other at any selected point on the volt-ampere characteristic in contrast to the operation of the circuit of FIGS. 1 and 2 in which the two regions are separated at a particular value of the emitter-to-collector voltage. One useful application for the circuit of FIG. 3 is in controlling a motor to operate in either of two speed ranges according to the signal at terminal 23.

*Other embodiments*

A circuit somewhat similar to FIG. 1 can be formed by connecting the diode 16 and the collector circuit of transistor **11*c* instead of in the circuit of transistor 10. A load connected in the emitter circuit of transistor 11 receives an amplified signal from transistor 10 when transistor 11 is prevented from conducting in its collector circuit and it receives current amplified by both transistors when transistor 11** conducts in its collector circuit.

In the explanation of the preferred circuit of FIG. 1 it was pointed out that the voltage across the combination of transistor 10 and diode 12 is substantially the same voltage across the emitter-collector terminals of transistor 11; connecting a portion of the load circuit between the collector terminal **11*c* and the output terminal of the circuit will make the voltage across the series combination of transistor 10 and diode 12 a function of the load current or voltage and thereby provide a further controlling signal for the diode 12. Similarly load condition responsive signals can be coupled to the circuit of diode 16** by means of a transformer.

It should also be apparent that the circuit of either FIG. 1 or FIG. 3 can be extended to several stages to provide three or more regions of differing gain.

From the two embodiments of the invention that have been described in detail and from the specific suggestions for variations, those skilled in the art will recognize a variety of applications for the circuit of this invention and variations in the specifically disclosed circuits within the spirit of the invention and the scope of the claims.

What is claimed is:

1. A circuit comprising:

a first and a second semiconductor amplifying device of the type having an output terminal, an input terminal, and a terminal conducting in common with said input and output terminals;

means coupling said second device input terminal to said first device common terminal such that the input current of said second device is a linear function of current at said first device common terminal;

means connecting said first device input terminal to receive a control signal; and means connecting said second device common terminal and the output terminal of at least one of said devices to control the current to a load;

wherein the improvement comprises:

means connected to control conduction at the output terminal of the other of said devices and operable when said other device common terminal has a current below a predetermined threshold value to have a substantially nonconducting state and operable when said output terminal current is above said threshold to have a state of low dynamic resistance whereby when said control means is in its nonconducting state, said other of said devices conducts only in the circuit of its input and common terminals without amplification and said one device operates as an amplifier and whereby when said control means is in its state of low dynamic resistance both said devices amplify.

2. A circuit according to claim 1 in which said means to control conduction is connected in the circuit of said first device output terminal whereby said first device is operable according to the state of said control means either to conduct without amplification between its input terminal, its common terminal, and said second device input terminal or to provide a current at said first device common terminal that is amplified with respect to a current at said first device input terminal.

3. A circuit according to claim 2 in which said means to control conduction at said first device output terminal comprises a two terminal device of the type operable to switch between a substantially nonconductive state and a conductive state.

4. A circuit according to claim 3 in which said means for controlling conduction is a nonlinear two terminal device of the type having a volt-ampere characteristic with an offset from zero along the voltage axis whereby the device is substantially nonconductive in response to a voltage across its terminal below a threshold and conducts with low dynamic resistance above said threshold.

5. A circuit according to claim 4 in which said two terminal device has one terminal connected to said semiconductor device output terminal and its other terminal connected in circuit with said second semiconductor device output terminal whereby the voltage across said device is a function of the conduction state of said second device.

6. A circuit according to claim 5 in which said two terminal device is connected between the output terminals of said first and second devices.

7. A circuit according to claim 2 in which said means for controlling conduction comprises a third device of the type having an output terminal, an input terminal, and a terminal common to both the input and output, said device having its output and common terminals connected to control conduction at said first device output terminal according to a signal applied to said third device input terminal.

References Cited

UNITED STATES PATENTS 3,158,800 11/1964 McPherson.

OTHER REFERENCES

IBM Technical Disclosure Bulletin, TCA Inverter, vol. 4, No. 2, July 1961, A. Gruodis and W. McAnney (330–24).

ROY LAKE, *Primary Examiner.*

JAMES B. MULLINS, *Assistant Examiner.*